(12) United States Patent
Gradl et al.

(10) Patent No.: US 9,095,058 B2
(45) Date of Patent: Jul. 28, 2015

(54) ELECTRODE STRUCTURE WITH SPATIAL INTERPOLATION FOR CAPACITIVE TOUCH PANEL

(71) Applicants: David Gradl, Naperville, IL (US);
Courtney Heron, Naperville, IL (US);
Mark Mathews, Lombard, IL (US)

(72) Inventors: David Gradl, Naperville, IL (US);
Courtney Heron, Naperville, IL (US);
Mark Mathews, Lombard, IL (US)

(73) Assignee: TOUCHSENSOR TECHNOLOGIES, LLC, Wheaton, IL (US)

( * ) Notice: Subject to any disclaimer, the term of this patent is extended or adjusted under 35 U.S.C. 154(b) by 183 days.

(21) Appl. No.: 13/688,493

(22) Filed: Nov. 29, 2012

(65) Prior Publication Data

US 2013/0133927 A1    May 30, 2013

Related U.S. Application Data

(60) Provisional application No. 61/565,016, filed on Nov. 30, 2011.

(51) Int. Cl.
*H05K 1/02* (2006.01)
*G06F 3/044* (2006.01)

(52) U.S. Cl.
CPC .............. *H05K 1/0296* (2013.01); *G06F 3/044* (2013.01)

(58) Field of Classification Search
None
See application file for complete search history.

(56) References Cited

U.S. PATENT DOCUMENTS

| | | | |
|---|---|---|---|
| 2002/0121146 A1* | 9/2002 | Manaresi et al. | 73/862.68 |
| 2009/0219258 A1* | 9/2009 | Geaghan et al. | 345/173 |
| 2010/0028811 A1* | 2/2010 | Geaghan | 430/319 |
| 2011/0018557 A1* | 1/2011 | Badaye | 324/658 |
| 2013/0015868 A1* | 1/2013 | Peng | 324/688 |

* cited by examiner

*Primary Examiner* — Gerald Johnson
*Assistant Examiner* — Maheen Javed
(74) *Attorney, Agent, or Firm* — Barnes & Thornburg LLP (57) ABSTRACT

A touch panel includes first and second sets of electrodes separated by a dielectric and oriented so that the electrodes of the first set intersect with the electrodes of the second set without touching. Each of the electrodes can be made of a plurality of individual conductors shorted together. The conductors can be provided in the form of flat cable or clock-spring material.

20 Claims, 4 Drawing Sheets

ELECTRODE STRUCTURE WITH SPATIAL INTERPOLATION FOR CAPACITIVE TOUCH PANEL

BACKGROUND OF THE INVENTION

A touch panel can include a plurality of drive electrodes (or "drive lines") and a plurality of sense electrodes (or "sense lines"), wherein the drive electrodes are separated from the sense electrodes by a dielectric material. For example, the drive electrodes and the sense electrodes can be embodied as thin and relatively narrow, elongated electrical traces disposed on opposite sides of a dielectric substrate. The drive electrodes may be oriented in a first direction and the sense electrodes may be oriented in a second direction so that the drive electrodes and sense electrodes intersect without touching. The drive electrodes and sense electrodes form capacitive sensors at the points of intersection.

The drive electrodes and sense electrodes are coupled to a control circuit as would be known to those skilled in the art. The control circuit periodically applies a strobe signal to one of the drive electrodes while at the same time tying the rest of the drive electrodes to ground. The strobe signal generates an electric field about the drive electrode. This electric field couples to the sense electrodes about the sensor locations formed by the drive electrode and the intersecting sense electrodes, thereby establishing mutual capacitances between the drive electrode and the sense electrodes ("drive-sense mutual capacitance") at each of these sensor locations.

The foregoing drive-sense mutual capacitances will have a steady state value in the absence of a stimulus proximate the respective sensor locations. Introduction of a stimulus, for example, a finger or other conductive object, proximate a particular sensor location can result in a portion of the electric field about that sensor location coupling to the stimulus, thereby establishing a mutual capacitance between the drive electrode and the stimulus at that sensor location. This phenomenon lessens the drive-sense mutual capacitance at that sensor location.

The control circuit detects the drive-sense mutual capacitance at each of the sensor locations. The control circuit distinguishes between the steady state drive-sense mutual capacitance at each of the sensor locations and the lessened drive-sense mutual capacitance resulting from introduction of a stimulus (if any) proximate the sensor location. The control circuit provides an output indicative of the presence or absence of a stimulus proximate a sensor location based on the drive-sense mutual capacitance at that sensor location.

In embodiments wherein the drive electrodes are relatively narrow traces, the density of the electric field about a strobed drive electrode is fairly uniform over the width of the drive electrode. In such embodiments, the manner in which the electric field couples to a stimulus proximate a strobed sensor is not significantly affected by the location of the stimulus with respect to the width of the drive electrode.

In some embodiments, the drive electrodes can be relatively wide. In such embodiments, the density of the electric field about a strobed drive electrode can vary significantly from the centerline of the drive electrode to the edges of the drive electrode, the electric field density generally being substantially greater about the centerline of the drive electrode than about the edges of the drive electrode. Accordingly, the proportion of the electric field that couples to a stimulus proximate a strobed drive electrode can vary substantially depending on the location of the stimulus with respect to the width of the drive electrode. A greater proportion of the electric field will couple to a particular stimulus located proximate the centerline of the drive electrode than to the same stimulus if proximate an edge of the drive electrode. As such, the drive-sense mutual capacitance at that sensor will be lower when a stimulus is introduced proximate the centerline of the electrode than if the same stimulus were introduced proximate an edge of the drive electrode.

The control circuit can distinguish between the lessened drive-sense mutual capacitance resulting from introduction of a stimulus proximate a sensor location about the centerline of the respective, relatively wide drive electrode and the lessened drive-sense mutual capacitance resulting from introduction of a stimulus proximate a sensor location about the edges of the respective, relatively wide drive electrode. Based on this distinction, the control circuit can provide an output indicative of whether the stimulus is proximate the centerline of the drive electrode or proximate the edges of the drive electrode.

To the extent that the control circuit deems the stimulus to be proximate an edge of the drive electrode, the control circuit, without more, cannot distinguish whether the stimulus is proximate one edge or the other. The control circuit, however, can subsequently strobe an adjacent drive electrode and detect the drive-sense mutual capacitances at the corresponding adjacent sensor. If the drive-sense mutual capacitance at the adjacent sensor is at steady state, indicating the absence of a stimulus there, the control circuit may deem the stimulus to be proximate the opposite edge of the previously-strobed drive electrode. If the drive-sense mutual capacitance at one of the adjacent sensors is less than steady state, indicating the presence of a stimulus there, the control circuit may deem the stimulus to be proximate the adjacent edge of the previously-strobed drive electrode.

DETAILED DESCRIPTION OF THE DRAWINGS

Figure 1:
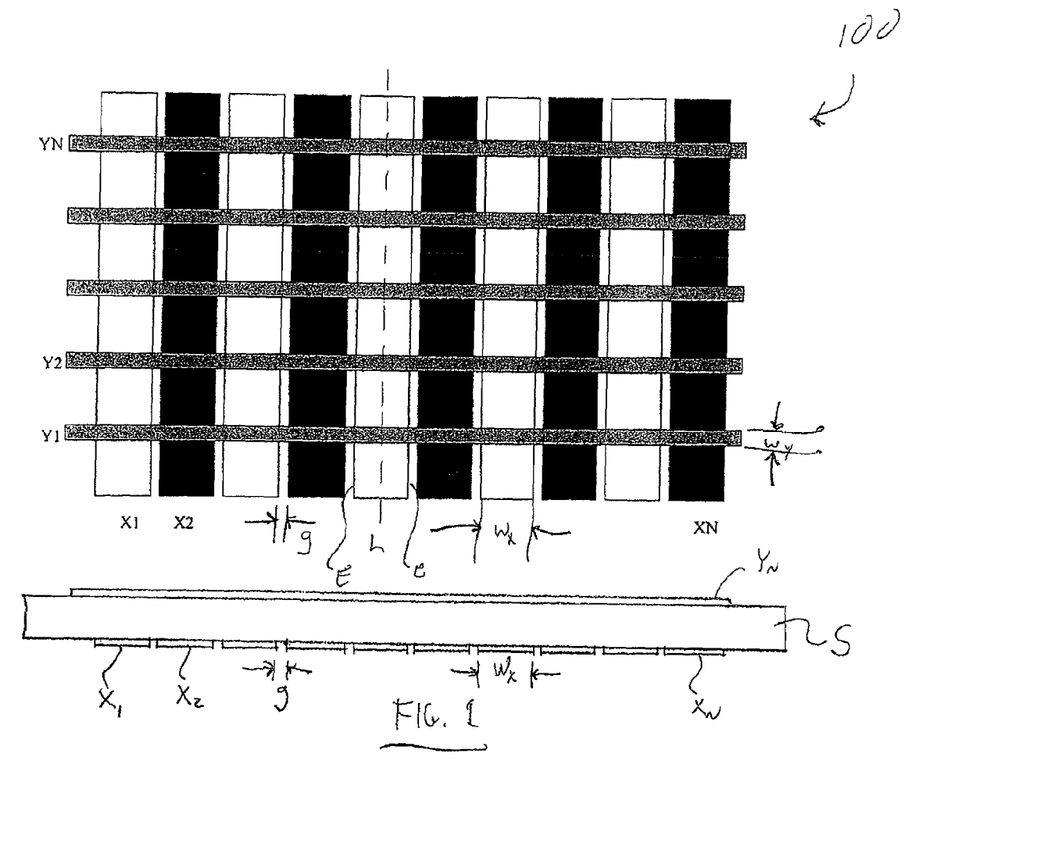
FIG. 1 illustrates an exemplary embodiment of a sensor array having a plurality of drive electrodes Xi, namely, drive electrodes X1-X10 and a plurality of sense electrodes Yj, namely, Y1-Y5, the drive electrodes Xi being substantially wider than the sense electrodes Yj.

FIG. 1 illustrates an exemplary embodiment of a sensor array 100 having a plurality of first electrodes (sometimes referred to herein as "drive electrodes") Xi disposed on a first side of a dielectric substrate S, and a plurality of second electrodes (sometimes referred to herein as "sense electrodes") Yj disposed on a second, opposite side of substrate S. In the illustrated embodiment, sensor array 100 includes ten drive electrodes Xi, namely drive electrodes X1-X10 and five sense electrodes Yj, namely, sense electrodes Y1-Y5. In other embodiments, sensor array 100 could include any practical number of drive electrodes Xi and any practical number of sense electrodes Yj.

Drive electrodes Xi are shown as being generally parallel to each other and oriented in a first direction. Sense electrodes Yj are shown as being generally parallel to each other and oriented in a second direction substantially perpendicular to the first direction. In other embodiments, they could be oriented in other relationships. Any or all of drive electrodes Xi, Yj could be made of copper, ITO or any other suitable transparent, translucent or opaque conductive material. Substrate S could be made of glass, plastic, PET or any other suitable dielectric material.

In the FIG. 1 embodiment, each of sense electrodes Yj has a similar, substantially uniform width "wy." Also, each of drive electrodes Xi has a similar, substantially uniform width "wx." The width wx of the drive electrodes is substantially greater than the width wy of the sense electrodes. For example, the width wx of the drive electrodes could be about 20 mm and the width wy of the sense electrodes could be about 1 mm. The gap "g" between adjacent drive electrodes may be about 30 microns (or narrower or wider). The gap between adjacent sense electrodes may be about 9 mm (or narrower or wider). Capacitive sensors are formed at the locations where the sense electrodes intersect with the drive electrodes. At least one end of each of electrodes Xi, Yj is coupled to a control circuit (not shown) of a type known to those skilled in the art. For example, the control circuit could be embodied as an mXT224 or mXT768 controller available from Atmel Corporation of San Jose, Calif.

In operation, the control circuit periodically strobes individual ones of the drive electrodes Xi while holding the other drive electrodes at ground potential. The strobe signal establishes an electric field that couples to the sense electrodes at the location where the sense electrodes intersect with the strobed drive electrode. This phenomenon establishes a mutual capacitance at each of the intersections of the strobed drive electrode and the sense electrodes. The control circuit monitors this mutual capacitance.

Introduction of a stimulus, for example, a human finger or other conductive object, proximate any of the sensor locations alters the mutual capacitance at that location. The control circuit senses this change in capacitance. If the change in mutual capacitance at a particular sensor location exceeds a predetermined threshold, the control circuit can deem that a touch has occurred at that sensor location. A particular stimulus (being of finite size) could simultaneously affect more than one sensor location. In the event a single stimulus is detected simultaneously at more than one sensor location, the control circuit can digitize, process and store the mutual capacitance values detected at the several sensor locations to predict the x and y coordinates of the center of the stimulus.

The mutual capacitance may be affected to a greater degree by a stimulus proximate the longitudinal axis "L" of the drive electrode than by a stimulus proximate an edge E of the drive electrode. A relative large change in mutual capacitance is indicative of the stimulus being proximate the longitudinal axis L of the drive electrode, and a relatively small change in mutual capacitance is indicative of the stimulus being proximate an edge of the drive electrode. An intermediate change in mutual capacitance is indicative of the stimulus being proximate a point intermediate the longitudinal axis L of the drive electrode and an edge of the drive electrode. Based on the change in mutual capacitance, the control circuit can determine whether the stimulus is proximate the longitudinal axis of the electrode, an edge of the electrode or a point between the longitudinal axis and an edge of the electrode. In some embodiments, the control circuit can interpolate/estimate the relative location of the stimulus between the longitudinal axis and an edge of the electrode based on the change in mutual capacitance.

Figure 2:
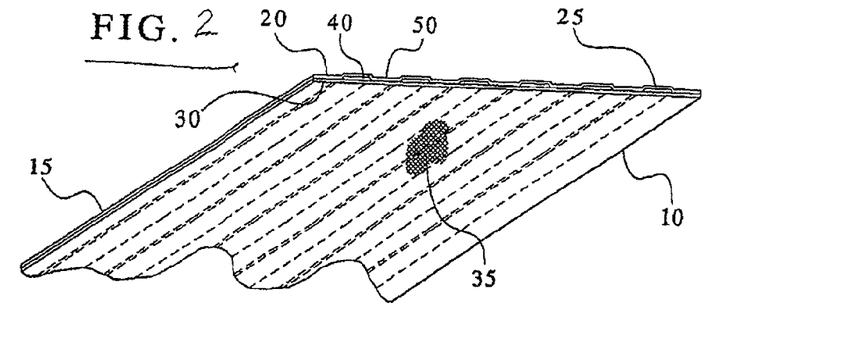
FIG. 2 illustrates an exemplary embodiment of a multi-conductor flat cable.

FIG. 2 illustrates an exemplary form of flat cable 10. Flat cable 10 includes a plurality of conductors 40 disposed between an upper layer 20 and a lower layer 30 of insulating material such that conductors 40 are separated from each other. Conductors 40 can be separated from each other by the insulating material, an adhesive joining the layers of insulating material, an air gap or otherwise. Conductors 40 may be individual strands of conductive material, for example, copper. Upper and lower layers 20, 30 may be made of polyester or another suitable material.

Flat cable 10 is shown as having six conductors. In other embodiments, flat cable 10 could have more or fewer than six conductors. All of the conductors of flat cable 10 are shown as being dimensionally similar and equally spaced, as would be the case in a preferred embodiment. In some embodiments, the dimensions of the individual conductors of flat cable 10 and spacing there between could vary from conductor to conductor.

Figure 8:
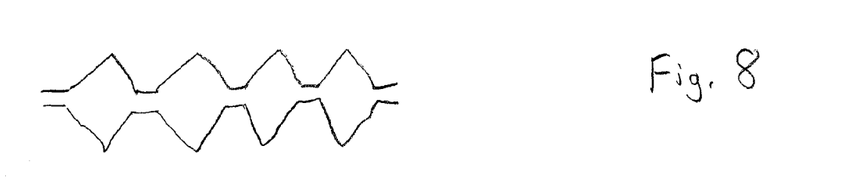
FIG. 8 illustrates a conductor having an alternative shape.

Flat cable 10 is shown as having conductors of uniform width and cross-section. In other embodiments, flat cable 10 could have conductors of non-uniform width and/or cross-section. For example, flat cable 10 could have conductors taking the form of interconnected diamond shapes, circular shapes, other polygonal or curvilinear shapes, or other regular or irregular shapes. FIG. 8 illustrates a conductor in the form of interconnected diamond shapes.

One example of a commercial embodiment of flat cable 10 is the bulk cable produced by Methode Electronics, Inc., of Chicago, Ill., under drawing number 15128. This cable includes 60 conductors sandwiched between two sheets of polyester. The conductors are arranged in six groups of ten. Each conductor has a width of about 1 mm and a thickness of about 4 mil. The center-to-center spacing of the conductors within each group of ten conductors is about 1.9 mm such that a gap of about 0.9 mm exists between adjacent conductors within a group of conductors. Adjacent groups of ten conductors are spaced about 20 mm apart, center-to-center, from each other such that the center-to-center spacing of adjacent conductors at the edges of adjacent groups of conductors is about 2 mm. The polyester sheets are sonically welded together between pairs of adjacent conductors, thereby capturing the conductors between the sheets and separating the conductors from each other. The polyester sheets have a thickness of about 3 mil each. Flat cable 10 could be configured, dimensioned, and made in other ways, as well. For example, all of the conductors of flat cable 10 could be equally spaced. Also, flat cable 10 could be made by using adhesives to apply conductors to a lower layer of insulating material and to apply an upper layer of insulating material to the foregoing subassembly.

Figure 3:
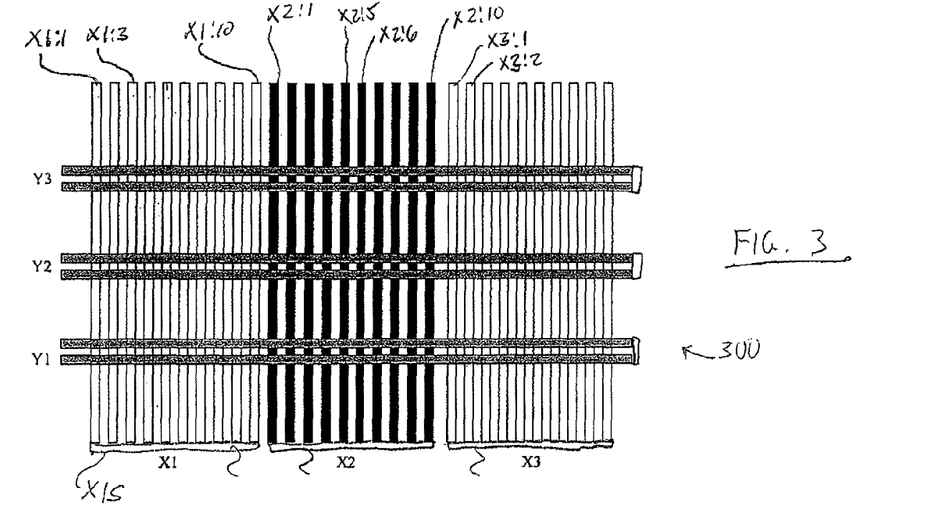
FIG. 3 illustrates an exemplary embodiment of a sensor array having a plurality of sense electrodes Yj comprising pairs of conductors and shorted together and a plurality of drive electrodes Xi comprising a plurality of conductors shorted together.

FIG. 3 illustrates an exemplary embodiment of a sensor array 300 having three drive electrodes X1-X3 and three sense electrodes Y1-Y3. In other embodiments, sensor array 300 could have any practical number of drive electrodes Xi and any practical number of sense electrodes Yj. Drive electrodes Xi are made from flat cable 10, for example, the Methode Electronics product set forth above or another commercially available or custom product having suitable conductor width and spacing for the intended application, as desired and as would be understood by one skilled in the art. Each of drive electrodes Xi includes ten adjacent conductors Xi:m, namely, conductors Xi:1-Xi:10, that are shorted together at one or both ends thereof. In other embodiments, each of drive electrodes Xi could include more or fewer than ten conductors Xi:m. Conductors Xi:m can be shorted together in any suitable way, for example, by means of a shorting bar or bus XiS, which could be located on a connected circuit platform. Each of drive electrodes Xi thus has an effective width substantially greater than the widths of its individual conductors Xi:m. Although conductors Xi:m are illustrated and described as having certain widths and spacing, conductors Xi:m could have other widths and spacing, as well.

Sense electrodes Yj are disposed upon flat cable 10 or an intervening substrate (not shown) at substantially right angles to drive electrodes Xi. The size of and spacing between sense electrodes Yj could be selected as desired and as would be understood by one skilled in the art. Sense electrodes Yj could be disposed upon flat cable 10 or the intervening substrate in various ways. For example, sense electrodes Yj could be discrete conductors applied directly to an insulating layer 20, 30 of flat cable 10 using any suitable technique or conductive material printed directly onto an insulating layer 20, 30 of flat cable 10. Alternatively, sense electrodes Yj could be disposed on an intervening dielectric substrate that would, in turn, be attached to flat cable 10. Because upper and lower layers 20, 30 of flat cable 10 are made of insulating material, any such intervening substrate typically would be used for convenience and not necessarily to provide a dielectric between drive electrodes Xi and sense electrodes Yj. An insulating sheet could be disposed upon sense electrodes Yj to protect and/or insulate them from neighboring structure.

In other embodiments, sense electrodes Yj could be made from a second flat cable (not shown) similar to flat cable 10 but including conductors sized and spaced as desired for use as sense electrodes, as would be understood by one skilled in the art. Such a second flat cable typically would include fewer and more widely spaced conductors than flat cable 10 because the arrangement of sense electrodes Yj in a given sensor array typically is much less dense than the arrangement of drive electrodes Xi in the sensor array. In such embodiments, the sensor array could be formed by simply disposing the second flat cable forming sense electrodes Yj upon flat cable 10 forming drive electrodes Xi and joining the two using adhesives, sonic welding or any other suitable technique.

In the exemplary embodiment illustrated in FIG. 3, sense electrodes Yj are made of a flat cable 10 from which superfluous conductors have been removed, and the flat cables 10 comprising the drive and sense electrodes Xi, Yj are disposed on an intervening polyester layer using intervening adhesive layers (not shown) having a combined thickness of about 33 mil, so that the drive and sense electrodes are separated in the z-direction by about 1 mm. In other embodiments, the drive and sense electrodes could be configured and separated in other ways.

FIG. 3 shows each of sense electrodes Yj including two conductors Yj:n, namely, conductors Yj:1 and Yj:2, shorted together. The two conductors Yj:n could be shorted together at one or both ends thereof using a shorting bar or bus YjS or in any other suitable manner. In the illustrated embodiments, each sense electrode Yj includes two conductors in order that each sense electrode Yj has sufficient surface area to allow an adequate drive-sense mutual capacitance to be established as discussed above. In other embodiments, each sense electrode Yj could include more, fewer, wider or narrower conductors.

Drive electrodes Xi and sense electrodes Yj are coupled to a control circuit having functionality similar to that described above in connection with FIG. 1. That is, the control circuit periodically strobes individual ones of the drive electrodes Xi (including all of its constituent conductors Xi:m) while holding the other drive electrodes at ground potential. When the control circuit strobes one of drive electrodes Xi, mutual capacitances are established between the strobed drive electrode and sense electrodes Yj at each intersection thereof. Introduction of a stimulus to any of these intersections (sensor locations) alters the mutual capacitance there. The control circuit monitors these mutual capacitances and changes thereto. When the change in mutual capacitance at a sensor location exceeds a predetermined threshold, the control circuit deems that a touch has occurred at that sensor location.

The interconnected conductors Xi:m of each drive electrode Xi form a drive electrode wherein conductors Xi:5 and Xi:6 essentially define the longitudinal axis of the drive electrode and conductors Xi:1 and Xi:10 define the edges of the drive electrode. The mutual capacitance at an intersection of the drive electrode with the sense electrodes may be affected to a greater degree by a stimulus proximate one or more of the conductors of the drive electrode near the longitudinal axis "L" of the drive electrode than by a stimulus proximate an edge of the drive electrode. A relatively large change in mutual capacitance is indicative of the stimulus being proximate the longitudinal axis L of the drive electrode, and a relatively small change in mutual capacitance is indicative of the stimulus being proximate an edge of the drive electrode. An intermediate change in mutual capacitance is indicative of the stimulus being proximate a point intermediate the longitudinal axis L of the drive electrode and an edge of the drive electrode. Based on the change in mutual capacitance, the control circuit can determine whether the stimulus is proximate the longitudinal axis of the electrode, an edge of the electrode or a point between the longitudinal axis and an edge of the electrode. In some embodiments, the control circuit can interpolate/estimate the relative location of the stimulus between the longitudinal axis and an edge of the electrode based on the change in mutual capacitance.

As such, the embodiment of FIG. 3 is functionally similar to the embodiment of FIG. 1 but is made using flat cable rather than discrete conductors for the drive electrodes.

Figure 4:
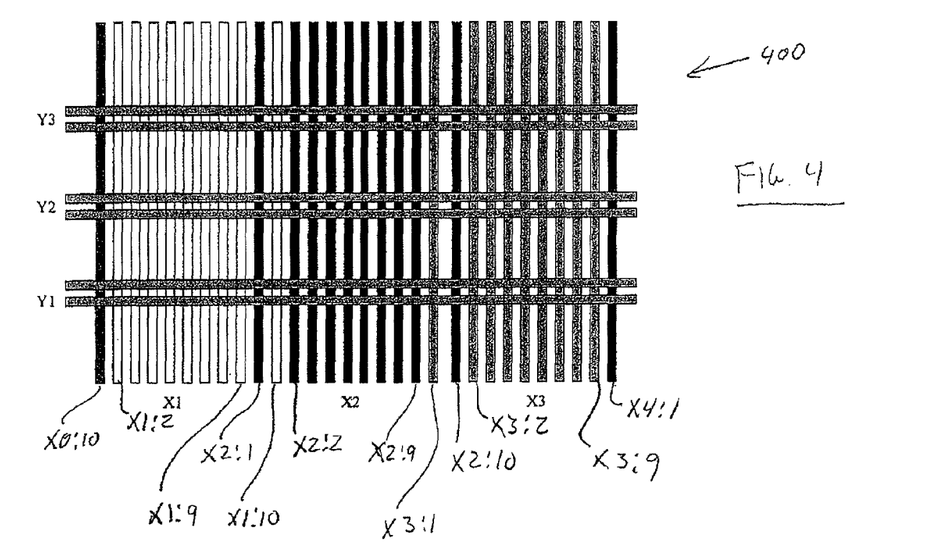
FIG. 4 illustrates another exemplary embodiment of a sensor array having a plurality of sense electrodes comprising pairs of conductors shorted together and a plurality of drive electrodes comprising a plurality of conductors shorted together in a first interpolated fashion.

FIG. 4 illustrates another exemplary embodiment of a sensor array 400. Sensor array 400 is similar to sensor array 300 except for the manner in which drive electrodes Xi are formed. In sensor array 300, drive electrodes Xi are formed by shorting together ten adjacent conductors Xi:1-Xi:10. In sensor array 400, drive electrodes Xi are formed by shorting together eight adjacent conductors Xi:2-Xi:9 and two conductors Xi:1 and Xi:10 spaced therefrom such that conductor X(i−1):10 of a first drive electrode X(i−1) is interposed between conductors Xi:1 and Xi:2 of a second drive electrode Xi adjacent to the first drive electrode, and conductor X(i+1):1 of a third drive electrode X(i+1) adjacent to the second drive electrode is interposed between conductors Xi:9 and Xi:10 of the second drive electrode. For example, as shown in FIG. 4, conductor X1:10 of first drive electrode X1 is interposed between conductors X2:1 and X2:2 of second drive electrode X2, and conductor X3:1 of third drive electrode X3 is interposed between conductors X2:9 and X2:10 of second drive electrode X2. (For clarity, shorting bars or buses XiS are not shown.)

The relationships between representative conductors of the various drive electrodes of sensor array 400 can be described as set forth in Table 1 below.

TABLE 1

| Conductor | Lies Between Conductors |
|---|---|
| X(i − 1): 7 | X(i − 1): 6 and X(i − 1): 8 |
| X(i − 1): 8 | X(i − 1): 7 and X(i − 1): 9 |
| X(i − 1): 9 | X(i − 1): 8 and Xi: 1 |
| X(i − 1): 10 | Xi: 1 and Xi: 2 |
| Xi: 1 | X(i − 1): 9 and X(i − 1): 10 |
| Xi: 2 | X(i − 1): 10 and Xi: 3 |
| Xi: 3 | Xi: 2 and Xi: 4 |
| Xi: 4 | Xi: 3 and Xi: 5 |
| Xi: 5 | Xi: 4 and Xi: 6 |
| Xi: 6 | Xi: 5 and Xi: 7 |
| Xi: 7 | Xi: 6 and Xi: 8 |
| Xi: 8 | Xi: 7 and Xi: 9 |
| Xi: 9 | Xi: 8 and X(i + 1): 1 |
| Xi: 10 | X(i + 1): 1 and X(i + 1): 2 |
| X(i + 1): 1 | Xi: 9 and Xi: 10 |
| X(i + 1): 2 | Xi: 10 and X(i + 1): 3 |
| X(i + 1): 3 | X(i + 1)2 and X(i + 1): 4 |
| X(i + 1): 4 | X(i + 1)3 and X(i + 1): 5 |

Sensor array 400 functions in substantially the same manner as sensor array 300 but may provide better or different resolution in the x-direction compared to sensor array 300.

Figure 5:
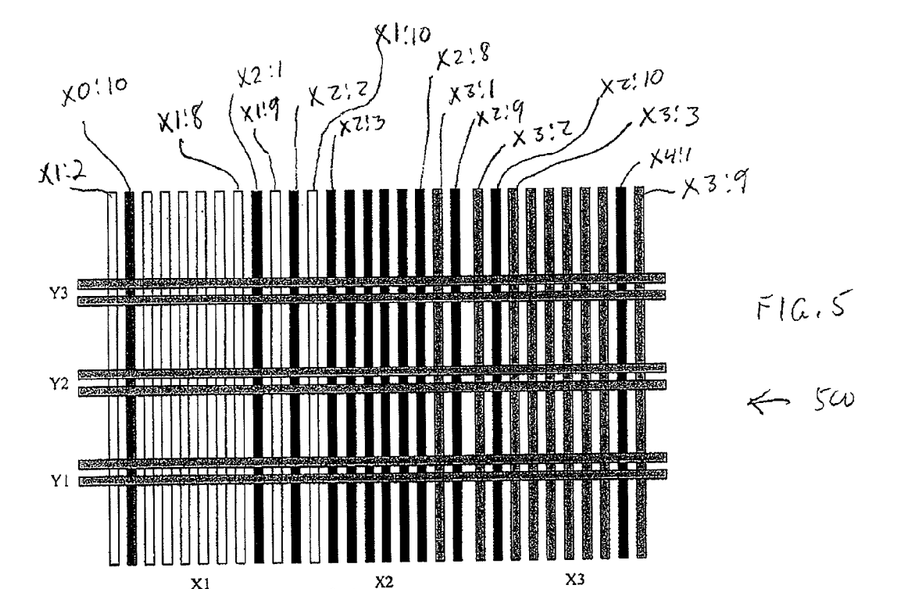
FIG. 5 illustrates yet another exemplary embodiment of a sensor array having a plurality of sense electrodes comprising pairs of conductors shorted together and a plurality of drive electrodes comprising a plurality of conductors shorted together in a second interpolated fashion.

FIG. 5 illustrates yet another exemplary embodiment of a sensor array 500. Sensor array 500 is similar to sensor arrays 300 and 400 except for the manner in which drive electrodes Xi are formed. In sensor array 500, drive electrodes Xi are formed by shorting together six adjacent conductors Xi:3-Xi:8 with four conductors Xi:1, Xi:2, Xi:9 and Xi:10 spaced therefrom such that conductor X(i−1):9 of a first drive electrode X(i−1) is interposed between conductors Xi:1 and Xi:2 of a second drive electrode Xi adjacent to the first drive electrode, conductor X(i−1):10 of the first drive electrode is interposed between conductors Xi:2 and Xi:3 of the second drive electrode, conductor X(i+1):1 of a third drive electrode X(i+1) adjacent to the second drive electrode is interposed between conductors Xi:8 and Xi:9 of the second drive electrode, and conductor X(i+1):2 of the third drive electrode is interposed between conductors Xi:9 and Xi:10 of the second drive electrode. For example, as shown in FIG. 5, conductor X1:9 of first drive electrode X1 is interposed between conductors X2:1 and X2:2 of second drive electrode X2, conductor X1:10 of first drive electrode X1 is interposed between conductors X2:2 and X2:3 of second drive electrode X2, conductor X3:1 of third drive electrode X3 is interposed between conductors X2:8 and X2:9 of second drive electrode X2, and conductor X3:2 of third drive electrode X3 is interposed between conductors X2:9 and X2:10 of second drive electrode X2. (For clarity, shorting bars or buses XiS are not shown.)

The relationships between representative conductors of the various drive electrodes of sensor array 500 can be described as set forth in Table 2 below.

TABLE 2

| Conductor | Lies Between Conductors |
|---|---|
| X(i − 1): 7 | X(i − 1): 6 and X(i − 1): 8 |
| X(i − 1): 8 | X(i − 1): 7 and Xi: 1 |
| X(i − 1): 9 | Xi: 1 and Xi: 2 |
| X(i − 1): 10 | Xi: 2 and Xi: 3 |
| Xi: 1 | X(i − 1): 8 and X(i − 1): 9 |
| Xi: 2 | X(i − 1): 9 and X(i − 1): 10 |

TABLE 2-continued

| Conductor | Lies Between Conductors |
|---|---|
| Xi: 3 | X(i − 1): 10 and Xi: 4 |
| Xi: 4 | Xi: 3 and Xi: 5 |
| Xi: 5 | Xi: 4 and Xi: 6 |
| Xi: 6 | Xi: 5 and Xi: 7 |
| Xi: 7 | Xi: 6 and Xi: 8 |
| Xi: 8 | Xi: 7 and X(i + 1): 1 |
| Xi: 9 | X(i + 1): 1 and X(i + 1): 2 |
| Xi: 10 | X(i + 1): 2 and X(i + 1): 3 |
| X(i + 1): 1 | Xi: 8 and Xi: 9 |
| X(i + 1): 2 | Xi: 9 and Xi: 10 |
| X(i + 1): 3 | Xi: 10 and X(i + 1): 4 |
| X(i + 1): 4 | X(i + 1)3 and X(i + 1): 5 |

Sensor array 500 functions in substantially the same manner as sensor arrays 300 and 400 but may provide better or different resolution in the x-direction compared to sensor array 300 or 400.

Figure 6:
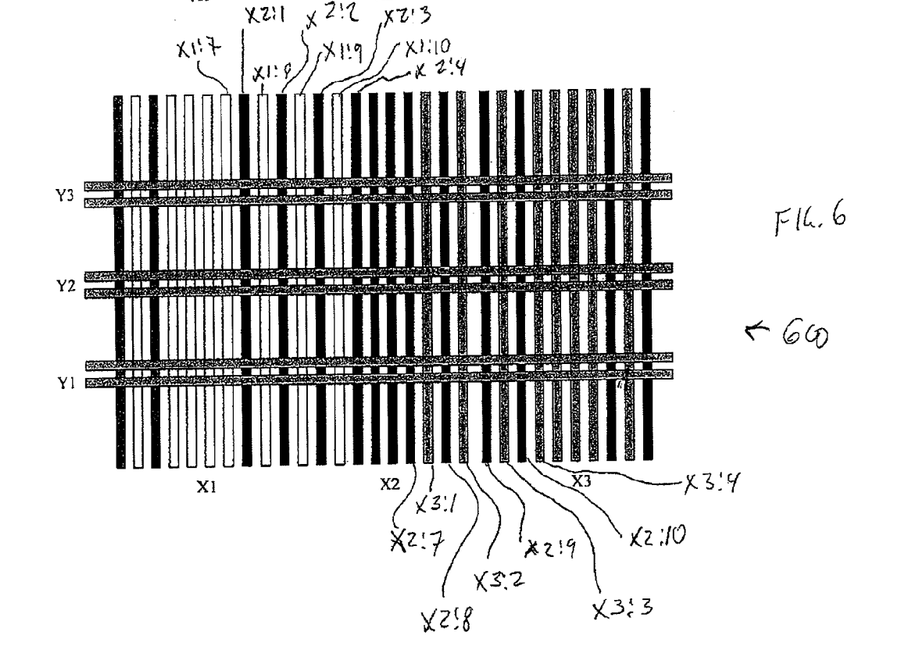
FIG. 6 illustrates a further exemplary embodiment of a sensor array having a plurality of sense electrodes comprising pairs of conductors shorted together and a plurality of drive electrodes comprising a plurality of conductors shorted together in a third interpolated fashion.

FIG. 6 illustrates a further exemplary embodiment of a sensor array 600. Sensor array 600 is similar to sensor arrays 300, 400 and 500 except for the manner in which drive electrodes Xi are formed. In sensor array 600, drive electrodes Xi are formed by shorting together four adjacent conductors Xi:4-Xi:7 with six conductors Xi:1-Xi:3 and Xi:8-Xi:10 spaced therefrom such that conductor X(i−1):8 of a first drive electrode X(i−1) is interposed between conductors Xi:1 and Xi:2 of a second drive electrode Xi adjacent to the first drive electrode, conductor X(i−1):9 of the first drive electrode is interposed between conductors Xi:2 and Xi:3 of the second drive electrode, conductor X(i−1):10 of the first drive electrode is interposed between conductors Xi:3 and Xi:4 of the second drive electrode, conductor X(i+1):1 of a third drive electrode adjacent to the second drive electrode is interposed between conductors Xi:7 and Xi:8 of the second drive electrode, conductor X(i+1):2 of the third drive electrode is interposed between conductors Xi:8 and Xi:9 of the second drive electrode and conductor X(i+1):3 of the third drive electrode is interposed between conductors Xi:9 and Xi:10 of the second drive electrode. For example, as shown in FIG. 6, conductor X1:8 of drive electrode X1 is interposed between conductors X2:1 and X2:2 of drive electrode X2, conductor X1:9 of drive electrode X1 is interposed between conductors X2:2 and X2:3 of drive electrode X2, conductor X1:10 of drive electrode X1 is interposed between conductors X2:3 and X2:4 of drive electrode X2, conductor X3:1 of drive electrode X3 is interposed between conductors X2:7 and X2:8 of drive electrode X2, conductor X3:2 of drive electrode X3 is interposed between conductors X2:8 and X2:9 of drive electrode X2, and conductor X3:3 of drive electrode X3 is interposed between conductors X2:9 and X2:10 of drive electrode X2. (For clarity, shorting bars or buses XiS are not shown.)

The relationships between representative conductors of the various drive electrodes of sensor array 600 can be described as set forth in Table 3 below.

TABLE 3

| Conductor | Lies Between Conductors |
|---|---|
| X(i − 1): 7 | X(i − 1): 6 and Xi: 1 |
| X(i − 1): 8 | Xi: 1 and Xi: 2 |
| X(i − 1): 9 | Xi: 2 and Xi: 3 |
| X(i − 1): 10 | Xi: 3 and Xi: 4 |
| Xi: 1 | X(i − 1): 7 and X(i − 1): 8 |
| Xi: 2 | X(i − 1): 8 and X(i − 1): 9 |
| Xi: 3 | X(i − 1): 9 and X(i − 1): 10 |

TABLE 3-continued

| Conductor | Lies Between Conductors |
|---|---|
| Xi: 4 | X(i − 1): 10 and Xi: 5 |
| Xi: 5 | Xi: 4 and Xi: 6 |
| Xi: 6 | Xi: 5 and Xi: 7 |
| Xi: 7 | Xi: 6 and X(i + 1): 1 |
| Xi: 8 | X(i + 1): 1 and X(i + 1): 2 |
| Xi: 9 | X(i + 1): 2 and X(i + 1): 3 |
| Xi: 10 | X(i + 1): 3 and X(i + 1): 4 |
| X(i + 1): 1 | Xi: 7 and Xi: 8 |
| X(i + 1): 2 | Xi: 8 and Xi: 9 |
| X(i + 1): 3 | Xi: 9 and Xi: 10 |
| X(i + 1): 4 | Xi: 10 and X(i + 1): 5 |

Sensor array 600 functions in substantially the same manner as sensor arrays 300, 400 and 500 but may provide better or different resolution in the x-direction compared to sensor array 300, 400 or 500.

Figure 7:
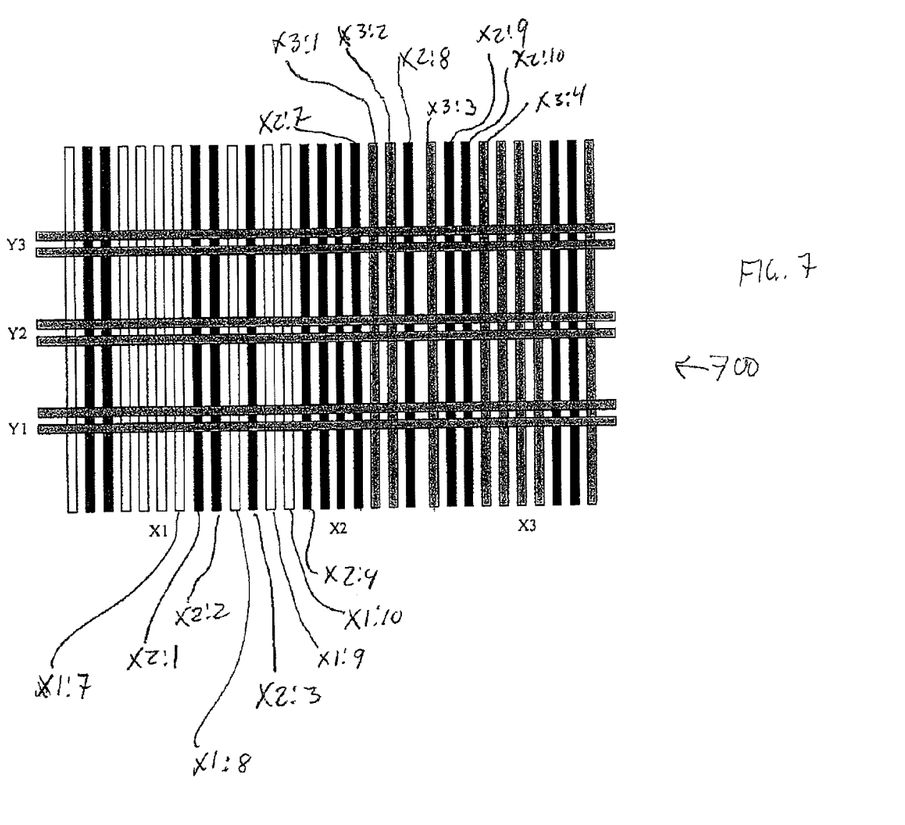
FIG. 7 illustrates still another exemplary embodiment of a sensor array having a plurality of sense electrodes comprising pairs of conductors shorted together and a plurality of drive electrodes comprising a plurality of conductors shorted together in a fourth interpolated fashion.

FIG. 7 illustrates still another exemplary embodiment of a sensor array 700. Sensor array 700 is similar to sensor arrays 300, 400, 500 and 600 except for the manner in which drive electrodes Xi are formed. In sensor array 700, drive electrodes Xi are formed by shorting together four adjacent conductors Xi:4-Xi:7 with six conductors Xi:1-Xi:3 and Xi:8-Xi:10, such that conductor X(i−1):8 of a first drive electrode X(i−1) is interposed between conductors Xi:2 and Xi:3 of a second drive electrode Xi adjacent to the first drive electrode, conductors Xi:1 and Xi:2 of the second drive electrode are interposed between conductors X(i−1):7 and X(i−1):8 of the first drive electrode, conductors X(i−1):9 and X(i−1):10 of the first drive electrode are interposed between conductors Xi:3 and Xi:4 of the second drive electrode, conductor Xi:3 of the second drive electrode is interposed between conductors X(i−1):8 and X(i−1):9 of the first drive electrode, conductors X(i+1):1 and X(i+1):2 of a third drive electrode adjacent to the second drive electrode are interposed between conductors Xi:7 and Xi:8 of the second drive electrode, conductor Xi:8 of the second drive electrode is interposed between conductors X(i+1):2 and X(i+1):3 of the third drive electrode, conductor X(i+1):3 of the third drive electrode is interposed between conductors Xi8 and Xi9 of the second drive electrode, and conductors Xi9 and Xi10 of the second drive electrode are interposed between conductors X(i+1):3 and X(i+1):4 of the third drive electrode. For example, as shown in FIG. 7, conductor X1:8 of drive electrode X1 is interposed between conductors X2:2 and X2:3 of drive electrode X2, conductors X2:1 and X2:2 of drive electrode X2 are interposed between conductors X1:7 and X1:8 of drive electrode X1, conductors X1:9 and X1:10 of drive electrode X1 are interposed between conductors X2:3 and X2:4 of drive electrode X2, conductor X2:3 of drive electrode X2 is interposed between conductors X1:8 and X1:9 of drive electrode X1, conductors X3:1 and X3:2 of drive electrode X3 are interposed between conductors X2:7 and X2:8 of drive electrode X2, conductors X2:8 of drive electrode X2 is interposed between conductors X3:2 and X3:3 of drive electrode X3, conductor X3:3 of drive electrode X3 is interposed between conductors X2:8 and X2:9 of drive electrode X2, and conductors X2:9 and X2:10 of drive electrode X2 are interposed between conductors X3:3 and X3:4 of drive electrode X3. (For clarity, shorting bars or buses XiS are not shown.)

The relationships between representative conductors of the various drive electrodes of sensor array 700 can be described as set forth in Table 4 below.

TABLE 4

| Conductor | Lies Between Conductors |
|---|---|
| X(i − 1): 7 | X(i − 1): 6 and Xi: 1 |
| X(i − 1): 8 | Xi: 2 and Xi: 3 |
| X(i − 1): 9 | Xi: 3 and X(i − 1): 10 |
| X(i − 1): 10 | X(i − 1): 9 and Xi: 4 |
| Xi: 1 | X(i − 1): 7 and Xi: 2 |
| Xi: 2 | Xi: 1 and X(i − 1): 8 |
| Xi: 3 | X(i − 1): 8 and X(i − 1): 9 |
| Xi: 4 | X(i − 1): 10 and Xi: 5 |
| Xi: 5 | Xi: 4 and Xi: 6 |
| Xi: 6 | Xi: 5 and Xi: 7 |
| Xi: 7 | Xi: 6 and X(i + 1): 1 |
| Xi: 8 | X(i + 1): 2 and X(i + 1): 3 |
| Xi: 9 | X(i + 1): 3 and Xi: 10 |
| Xi: 10 | Xi: 9 and X(i + 1): 4 |
| X(i + 1): 1 | Xi: 7 and X(i + 1): 2 |
| X(i + 1): 2 | X(i + 1): 1 and Xi: 8 |
| X(i + 1): 3 | Xi: 8 and Xi: 9 |
| X(i + 1): 4 | Xi: 10 and X(i + 1): 5 |

Sensor array 700 functions in substantially the same manner as sensor arrays 300, 400, 500 and 600 but may provide better or different resolution in the x-direction compared to sensor array 300, 400, 500 or 600.

In other embodiments, drive electrodes Xi could include more or fewer than ten conductors and the conductors could be shorted together in different interpolated arrangements.

One skilled in the art would recognize that the foregoing relationships between the conductors of the drive electrodes of the various sensor arrays disclose might not be readily applicable at the edges of the respective sensor arrays. As such, the drive electrodes at the edges of the sensor array could have more or fewer conductors than the drive electrodes away from the edges of the sensor array. Similarly, the sense electrodes at the edges of the sensor array could have more or fewer conductors than the sense electrodes away from the edges of the sensor array.

Any of sensor arrays 300-700 could be disposed on a surface of a substrate (not shown), for example, a user interface panel made of glass, plastic, or another suitable material. Proximity or touch of a stimulus, for example, a user's finger or another conductive object, to an opposite surface of the substrate could affect the sensors formed by the drive and sense electrodes, as discussed further above and below. In an illustrative embodiment, the substrate could be a 3.5 mm thick glass panel. In other embodiments, the substrate could be configured and dimensioned in other ways.

Sensor arrays 300-700 are described herein as having electrode structures in the form of flat cable. Alternatively, the sensor arrays could have electrode structures embodied in other ways. For example, the electrode structures, or any portion thereof, could be disposed directly onto a glass, plastic, or other suitable substrate using any suitable technique, including without limitation, plating and etching of suitable conductive materials, or printing of conductive inks using screen printing or ink jet printing processes.

The embodiments described herein are illustrative, and they are not intended to limit the scope of the invention as defined by the following claims.

The invention claimed is:
1. A touch-detection apparatus comprising:
a first multi-conductor flat cable, said first multi-conductor flat cable comprising first and second layers of insulating material and a plurality of spaced-apart elongated conductors in a side-by-side arrangement disposed between said first and second layers of insulating mate- rial, said first and second layers of insulating material joined together between adjacent pairs of said elongated conductors;

a first electrode structure comprising first ones of said plurality of elongated conductors of said first multi-conductor flat cable electrically connected to one another;

a second electrode structure comprising second ones of said plurality of elongated conductors of said first multi-conductor flat cable electrically connected to one another;

a second multi-conductor flat cable disposed on said first multi-conductor flat cable, said second multi-conductor flat cable comprising first and second layers of insulating material and a plurality of spaced-apart elongated conductors in a side-by-side arrangement disposed between said first and second layers of insulating material, said first and second layers of insulating material joined together between adjacent pairs of said elongated conductors; and a third electrode structure comprising at least one of said plurality of elongated conductors of said second multi-conductor flat cable, said at least one of said plurality of elongated conductors of said second multi-conductor flat cable intersecting at least certain ones of said conductors of said first electrode structure and said conductors of said second electrode structure while separated therefrom by one of said first and second layers of insulating material of said first multi-conductor flat cable and one of said first and second layers of insulating material of said second multi-conductor flat cable.

2. The apparatus of claim 1 further comprising a control circuit connected to each of said first, second and third electrode structures, said control circuit adapted to detect proximity of a stimulus to an intersection of said first electrode structure with said third electrode structure; proximity of said stimulus to an intersection of said second electrode structure with said third electrode structure; or proximity of said stimulus to an intersection of said first electrode structure with said third electrode structure and to an intersection of said second electrode structure with said third electrode structure.

3. The apparatus of claim 2 wherein said third electrode structure comprises a plurality of said conductors of said second multi-conductor flat cable.

4. The apparatus of claim 2 wherein certain ones of said conductors of said first electrode structure are interposed between certain ones of said conductors of said second electrode structure.

5. The apparatus of claim 4 wherein a first of said conductors of said first electrode structure is interposed between a first conductor and a second conductor of said second electrode structure.

6. The apparatus of claim 5 wherein said first of said conductors of said second electrode structure is interposed between said first conductor and a second conductor of said first electrode structure.

7. The apparatus of claim 6 further comprising a fourth electrode structure comprising third ones of said plurality of elongated conductors of said first multi-conductor flat cable electrically connected to one another.

8. The apparatus of claim 7 wherein a first of said conductors of said fourth electrode structure is interposed between said second and a third conductors of said second electrode structure.

9. The apparatus of claim 8 wherein said third of said conductors of said second electrode structure is interposed between said first and a second of said conductors of said fourth electrode structure.

10. An touch-detection apparatus comprising:

a first multi-conductor flat cable, said first multi-conductor flat cable comprising first and second layers of insulating material, a plurality of spaced-apart elongated conductors disposed between said first and second layers of insulating material, said first and second layers of insulating material joined together between adjacent pairs of said plurality of spaced-apart elongated conductors;

a plurality of drive electrode structures each comprising respective ones of said plurality of elongated conductors of said first multi-conductor flat cable electrically connected to one another;

a second multi-conductor flat cable disposed on said first multi-conductor flat cable, said second multi-conductor flat cable comprising first and second layers of insulating material and a plurality of spaced-apart elongated conductors in a side-by-side arrangement disposed between said first and second layers of insulating material, said first and second layers of insulating material joined together between adjacent pairs of said elongated conductors: and a sense electrode comprising at least one of said plurality of elongated conductors of said second multi-conductor flat cable, said at least one of said plurality of elongated conductors of said second multi-conductor flat cable intersecting at least some of said plurality of conductors of at least some of said plurality of drive electrode structures while separated therefrom by one of said first and second layers of insulating material of said first multi-conductor flat cable and one of said first and second layers of insulating material of said second multi-conductor flat cable.

11. The apparatus of claim 10 further comprising a control circuit connected to each of said drive electrode structures and said sense electrode structure, said control circuit adapted to detect proximity of a stimulus proximate an intersection of one of said drive electrode structures with said sense electrode structure.

12. The apparatus of claim 11 wherein said sense electrode structure comprises a plurality of said conductors of said second multi-conductor flat cable.

13. The apparatus of claim 11 wherein at least one conductor of a first of said drive electrode structures is interposed between a first pair of conductors of a second of said drive electrode structures and wherein at least one conductor of said second of said drive electrode structures is interposed between a first pair of conductors of said first of said drive electrode structures.

14. The apparatus of claim 13 wherein at least one conductor of a third of said drive electrode structures is interposed between another pair of conductors of said second of said drive electrode structures.

15. The apparatus of claim 11 wherein at least one conductor of a first of said drive electrode structures is interposed between a first pair of conductors of a second of said drive electrode structures, wherein at least another conductor of said first of said drive electrode structures is interposed between a second pair of conductors of said second of said drive electrode structures, wherein at least one conductor of said second of said drive electrode structures is interposed between a first pair of conductors of said first of said drive electrode structures, and wherein at least another conductor of said second of said drive electrode structures is interposed between a second pair of conductors of said first of said drive electrode structures.

16. The apparatus of claim 15 wherein at least one conductor of a third of said drive electrode structures is interposed between another pair of conductors of said second of said drive electrode structures.

17. The apparatus of claim 16 wherein at least another conductor of said third of said drive electrode structures is interposed between a further pair of conductors of said second of said drive electrode structures.

18. The apparatus of claim 11 wherein said control circuit also is adapted to determine the relative location of said stimulus with respect to a longitudinal axis and an edge of said one of said drive electrode structures.

19. The apparatus of claim 11 wherein said control circuit also is adapted to determine the relative location of said stimulus with respect to ones of said conductors of said one of said drive electrode structures.

20. The apparatus of claim 19 wherein said control circuit determines the relative location of said stimulus with respect to a specific one or ones of said conductors of said one of said drive electrode structures based on a relative change in mutual capacitance.

\* \* \* \* \*